United States Patent
Nishimura et al.

(10) Patent No.: US 8,124,253 B2
(45) Date of Patent: Feb. 28, 2012

(54) TUNNELING MAGNETIC SENSING ELEMENT INCLUDING MGO FILM AS INSULATING BARRIER LAYER

(75) Inventors: Kazumasa Nishimura, Niigata-ken (JP); Masamichi Saito, Niigata-ken (JP); Yosuke Ide, Niigata-ken (JP); Ryo Nakabayashi, Niigata-ken (JP); Yoshihiro Nishiyama, Niigata-ken (JP); Hidekazu Kobayashi, Niigata-ken (JP); Naoya Hasegawa, Niigata-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 77 days.

(21) Appl. No.: 12/615,689

(22) Filed: Nov. 10, 2009

(65) Prior Publication Data
US 2010/0055452 A1    Mar. 4, 2010

(30) Foreign Application Priority Data

May 11, 2007  (JP) ................................. 2007-126420
Apr. 30, 2008  (WO) .................. PCT/JP2008/058244

(51) Int. Cl.
*G11B 5/39* (2006.01)

(52) U.S. Cl. ............... 428/811.1; 360/324.2; 428/811.5; 428/816

(58) Field of Classification Search ........................ None
See application file for complete search history.

(56) References Cited

U.S. PATENT DOCUMENTS
5,766,743 A * 6/1998 Fujikata et al. ............... 428/212
(Continued)

FOREIGN PATENT DOCUMENTS
JP             2000-106462            4/2000
(Continued)

OTHER PUBLICATIONS
JPO Abstract Translation of JP 2007-096105-A.*

*Primary Examiner* — Kevin Bernatz
(74) *Attorney, Agent, or Firm* — Brinks Hofer Gilson & Lione

(57) ABSTRACT

A tunneling magnetic sensing element includes a laminate in which an underlayer, a seed layer, an antiferromagnetic layer, a pinned magnetic layer, an insulating barrier layer, and a free magnetic layer are laminated in order from below. The insulating barrier layer is made of Mg—O. The underlayer is made of Ti, and the seed layer is made of one selected from a group consisting of Ni—Fe—Cr and Ru.

2 Claims, 5 Drawing Sheets

U.S. PATENT DOCUMENTS

| | | | |
|---|---|---|---|
| 7,821,748 B2 * | 10/2010 | Fukuzawa et al. | 360/324.2 |
| 2004/0223267 A1 * | 11/2004 | Childress et al. | 360/324.2 |
| 2006/0291097 A1 * | 12/2006 | Honda et al. | 360/126 |
| 2007/0081276 A1 | 4/2007 | Fukuzawa et al. | |
| 2008/0055792 A1 * | 3/2008 | Zheng et al. | 360/324.2 |
| 2008/0074799 A1 * | 3/2008 | Ishiwata | 360/314 |
| 2008/0080102 A1 * | 4/2008 | Ibusuki et al. | 360/324.2 |
| 2008/0170337 A1 * | 7/2008 | Hirata et al. | 360/324.2 |

FOREIGN PATENT DOCUMENTS

| | | |
|---|---|---|
| JP | 2001-084532 | 3/2001 |
| JP | 2001-156357 | 6/2001 |

* cited by examiner

TUNNELING MAGNETIC SENSING ELEMENT INCLUDING MGO FILM AS INSULATING BARRIER LAYER

RELATED APPLICATIONS

The application is a continuation of International Application No. PCT/JP2008/058244, filed on Apr. 30, 2008, which claims priority to Japanese Patent Application No. 2007-126420 filed in the Japanese Patent Office on May 11, 2007, the entire contents of which being incorporated herein by reference.

BACKGROUND

1. Technical Field

The present invention relates to a tunneling magnetic sensing element including an insulating barrier layer made of Mg—O, and in particular, to a tunneling magnetic sensing element which can achieve improvement in a rate of change in resistance ($\Box R/R$).

2. Related Art

A tunneling magnetic sensing element (TMR element) is a device having resistance changed by a tunneling effect. When the magnetization direction of a pinned magnetic layer is antiparallel to the magnetization direction of a free magnetic layer, a tunneling current does not easily flow through an insulating barrier layer provided between the pinned magnetic layer and the free magnetic layer, thereby maximizing the resistance. In contrast, when the magnetization direction of the pinned magnetic layer is parallel to the magnetization direction of the free magnetic layer, the tunneling current easily flows, and thus the resistance is maximized.

As the magnetization direction of the free magnetic layer changes by the effect of an external magnetic field on the basis of this principle, the changes in electrical resistance are detected as changes in voltage so as to detect a leakage magnetic field from a recording medium.

Japanese Unexamined Patent Application Publication Nos. 2000-106462, 2001-84532, and 2001-156357 are examples of the related art.

SUMMARY

It has been known that, when the insulating barrier layer of the tunneling magnetic sensing element is made of Mg—O (magnesium oxide), a higher rate of change in resistance ($\Delta R/R$) can be achieved, as compared with a case where the insulating barrier layer is made of Al—O or Ti—O.

However, in order to cope with high density recording, a further increase in the rate of change in resistance ($\Delta R/R$) is needed.

In particular, it is preferable to increase the rate of change in resistance ($\Delta R/R$) while decreasing the RA (element resistance R×element area A). However, if the RA decreases, the rate of change in resistance ($\Delta R/R$) tends to decrease. In the related art, it is difficult to increase the rate of change in resistance ($\Delta R/R$) while decreasing the RA.

For example, if the material of the free magnetic layer or the pinned magnetic layer is changed so as to increase the rate of change in resistance ($\Delta R/R$), the soft magnetic properties of the free magnetic layer or the force for pinning the magnetization of the pinned magnetic layer may change, which causes unstable reproduction characteristics.

In the tunneling magnetic sensing element, an underlayer is formed as a base layer, and a seed layer for adjusting crystal orientation is formed on the underlayer. In the related art, however, there is no discussion of an effective combination of materials for the underlayer and the seed layer so as to increase the rate of change in resistance ($\Delta R/R$) while decreasing the RA.

It is desirable to provide a tunneling magnetic sensing element including an insulating barrier layer made of Mg—O, which improves the materials of the underlayer and the seed layer, thereby ensuring an increase in the rate of change in resistance ($\Delta R/R$), as compared with the related art.

A tunneling magnetic sensing element according to an embodiment of the invention includes a laminate in which an underlayer, a seed layer, an antiferromagnetic layer, a pinned magnetic layer, an insulating barrier layer, and a free magnetic layer are laminated in order from below. The insulating barrier layer is made of Mg—O. The underlayer is made of Ti, and the seed layer is made of one selected from Ni—Fe—Cr and Ru.

With this configuration, in a tunneling magnetic sensing element including an insulating barrier layer made of Mg—O, it is possible to increase the rate of change in resistance ($\Delta R/R$) while decreasing the RA.

The seed layer may be made of Ni—Fe—Cr. Therefore, it is possible to increase the rate of change in resistance ($\Delta R/R$) more effectively.

The average thickness of the underlayer may be equal to or larger than 10 Å and equal to or smaller than 100 Å. With this configuration, it is possible to effectively increase the rate of change in resistance ($\Delta R/R$), and also to decrease a gap length (GL) between upper and lower shield layers.

According to the embodiment of the invention, in a tunneling magnetic sensing element including an insulating barrier layer made of Mg—O, it is possible to increase the rate of change in resistance ($\Delta R/R$) while decreasing the RA.

DESCRIPTION OF EXEMPLARY EMBODIMENTS

Figure 1:
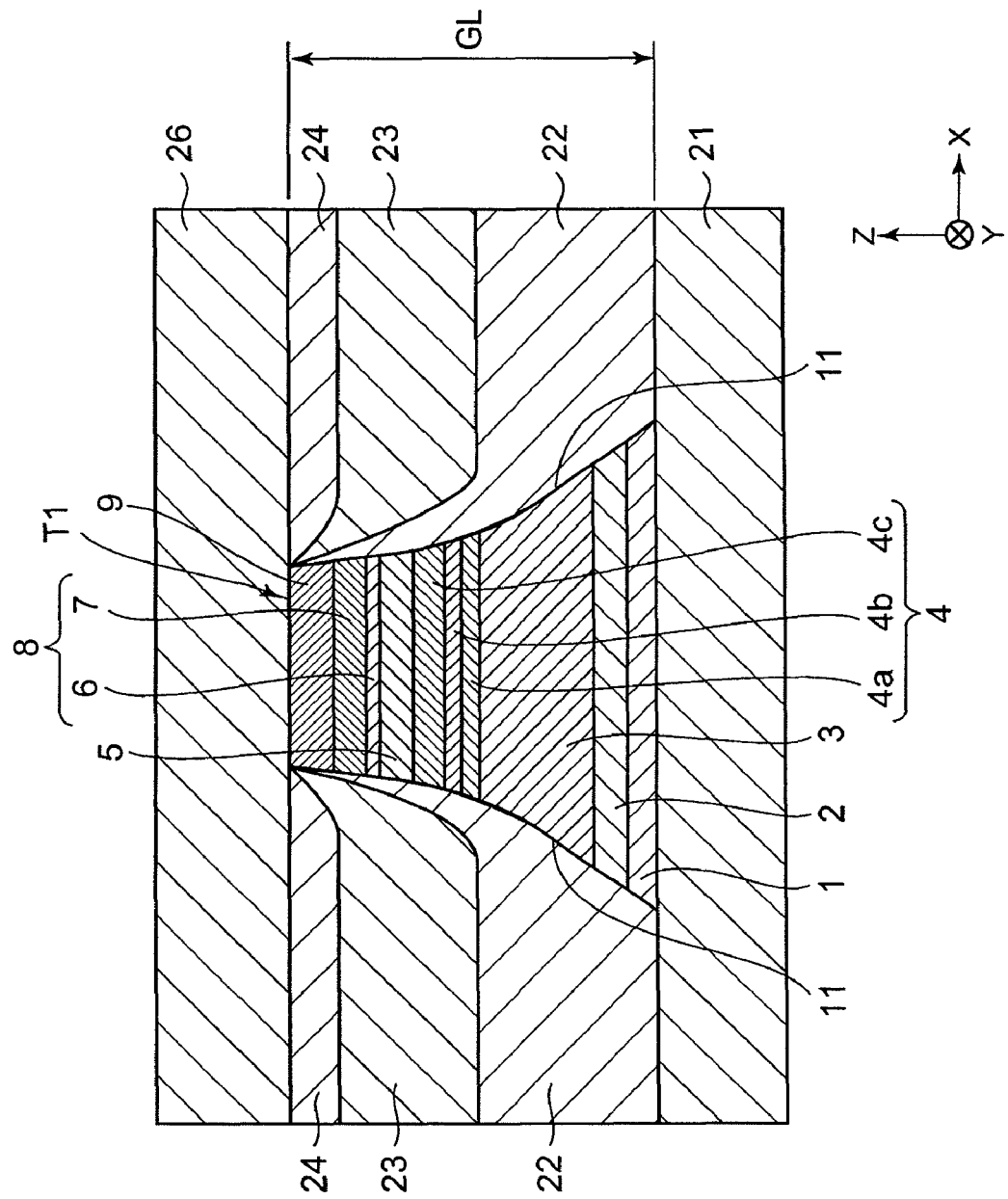
FIG. 1 is a sectional view of a tunneling magnetic sensing element taken in a direction parallel to a surface facing a recording medium.

FIG. 1 is a sectional view of a tunneling magnetic sensing element of this embodiment taken in a direction parallel to a surface facing a recording medium.

The tunneling magnetic sensing element is to be installed at a trailing side end of a floating slider of a hard disk device to detect a leakage magnetic field (recording magnetic field) from a magnetic recording medium. In FIG. 1, the X direction is the track width direction, the Y direction is the direction of the leakage magnetic field from the magnetic recording medium (height direction), and the Z direction is the direction of movement of the magnetic recording medium and the direction in which layers of the tunneling magnetic sensing element are laminated.

Referring to FIG. 1, a lower shield layer 21 made of, for example, Ni—Fe is formed at the bottom. A laminate T1 is formed on the lower shield layer 21. The tunneling magnetic sensing element has the laminate T1, and an insulating layer 22, a hard bias layer 23, and a protective layer 24, all of which are formed on both sides of the laminate T1 in the track width direction (the X direction in FIG. 1).

A base layer of the laminate T1 is an underlayer 1 made of Ti. A seed layer 2 is provided on the underlayer 1. The seed layer 2 is made of one selected from Ni—Fe—Cr and Ru.

An antiferromagnetic layer 3 formed on the seed layer 2 is preferably made of an antiferromagnetic material containing an element □ (where the element □ is at least one element selected from Pt, Pd, Ir, Rh, Ru, and Os) and Mn.

The antiferromagnetic layer 3 may be made of an antiferromagnetic material containing the element □, an element □' (where the element □' is at least one element selected from Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements), and Mn.

The antiferromagnetic layer 3 is made of, for example, Ir—Mn.

A pinned magnetic layer 4 is formed on the antiferromagnetic layer 3. The pinned magnetic layer 4 has a laminated ferrimagnetic structure in which a first pinned magnetic layer 4a, a nonmagnetic intermediate layer 4b, and second pinned magnetic layer 4c are laminated in order from below. The magnetization direction of the first pinned magnetic layer 4a and the magnetization direction of the second pinned magnetic layer 4c are made antiparallel to each other by an exchange coupling magnetic field (Hex) at the interface between the pinned magnetic layer 4 and the antiferromagnetic layer 3 and an antiferromagnetic exchange coupling magnetic field (Ruderman-Kittel-Kasuya-Yosida interaction, that is, RKKY interaction) through the nonmagnetic intermediate layer 4b. With the pinned magnetic layer 4 having a laminated ferrimagnetic structure, the magnetization direction of the pinned magnetic layer 4 can be stabilized, and the exchange coupling magnetic field generated at the interface between the pinned magnetic layer 4 and the antiferromagnetic layer 3 can be apparently increased. The first pinned magnetic layer 4a and the second pinned magnetic layer 4c are formed so as to have a thickness of about 10 to 40 Å, and the nonmagnetic intermediate layer 4b is formed so as to have a thickness of about 8 Å to 10 Å.

The first pinned magnetic layer 4a is made of a ferromagnetic material, such as Co—Fe, Ni—Fe, Co—Fe—Ni, or the like. The second pinned magnetic layer 4c may be made of the same material as the first pinned magnetic layer 4a. Preferable examples of the material for the second pinned magnetic layer 4c will be described below. The nonmagnetic intermediate layer 4b is made of a nonmagnetic conductive material, such as Ru, Rh, Ir, Cr, Re, Cu, or the like.

An insulating barrier layer 5 made of Mg—O (magnesium oxide) is formed on the pinned magnetic layer 4. The composition ratio of Mg in the Mg—O alloy is preferably in a range of 40 to 60 at %. Most preferably, Mg50 at % O50 at % is used.

A free magnetic layer 8 is formed on the insulating barrier layer 5. The free magnetic layer 8 is formed so as to have a laminated structure of an enhance layer 6 and a soft magnetic layer 7. The enhance layer 6 is disposed between the insulating barrier layer 5 and the soft magnetic layer 7 and is made of a material having a spin polarization ratio higher than that of the soft magnetic layer 7. Meanwhile, the soft magnetic layer 7 is made of a material having excellent soft magnetic properties, such as a low coercive force, a low anisotropic magnetic field, and the like, as compared with the enhance layer 6. The enhance layer 6 is made of, for example, Co—Fe, and the soft magnetic layer 7 is made of, for example, Ni—Fe. The composition ratio of Co in the Co—Fe alloy of the enhance layer 6 is preferably in a range of 0 to 75 at %. The composition ratio of Fe in the Ni—Fe alloy of the soft magnetic layer 7 is preferably in a range of 10 at % to 20 at %.

The width dimension of the free magnetic layer 8 in the track width direction (the X direction in FIG. 1) determines the track width Tw.

A protective layer 9 made of Ta or the like is formed on the free magnetic layer 8.

End surfaces 11 and 11 of the laminate T1 on both sides in the track width direction (the X direction in FIG. 1) form inclined surfaces so that the width dimension in the track width direction gradually tapers upward.

As shown in FIG. 1, an insulating layer 22 is formed so as to cover the lower shield layer 21 and the end surfaces 11 of the laminate T1, which extend to both sides of the laminate Ti. A hard bias layer 23 is formed on the insulating layer 22, and a protective layer 24 is formed on the hard bias layer 23. The protective layer 24 is made of a nonmagnetic material, such as Ta or the like.

A bias underlayer (not shown) may be formed between the insulating layer 22 and the hard bias layer 23. The bias underlayer is made of Cr, W, Ti, or the like.

The insulating layer 22 is made of an insulating material, such as Al2O3 or SiO2. The insulating layer 22 insulates the lower part of the hard bias layer 23 in order to prevent a current flowing in the laminate T1 in a direction perpendicular to the interfaces of the layers from separately flowing to both sides of the laminate T1 in the track width direction. The hard bias layer 23 is made of, for example, Co—pt or Co—Cr—Pt.

An upper shield layer 26 made of, for example, Ni—Fe or the like is formed on the laminate T1 and the protective layer 24.

In the embodiment shown in FIG. 1, the lower shield layer 21 and the upper shield layer 26 function as electrode layers for the laminate T1, and a current flows in a direction perpendicular to the surfaces of the layers of the laminate T1 (a direction parallel to the Z direction in FIG. 1).

The free magnetic layer 8 is magnetized in a direction parallel to the track width direction (the X direction in FIG. 1) by a bias magnetic field from the hard bias layer 23. On the other hand, the first pinned magnetic layer 4a and the second pinned magnetic layer 4c constituting the pinned magnetic layer 4 are magnetized in a direction parallel to the height direction (the Y direction in FIG. 1). The pinned magnetic layer 4 has a laminated ferrimagnetic structure, so the first pinned magnetic layer 4a and the second pinned magnetic layer 4c are magnetized antiparallel to each other. The magnetization direction of the pinned magnetic layer 4 is pinned (that is, the magnetization direction of the pinned magnetic layer 4 is not changed by an external magnetic field), but the magnetization direction of the free magnetic layer 8 is changed by an external magnetic field.

If the magnetization direction of the free magnetic layer 8 is changed by an external magnetic field, when the magnetization direction of the second pinned magnetic layer 4c and the magnetization direction of the free magnetic layer 8 are made antiparallel to each other, a tunneling current does not easily flow through the insulating barrier layer 5 provided between the second pinned magnetic layer 4c and the free magnetic layer 8, thereby maximizing the resistance. In contrast, when the magnetization direction of the second pinned magnetic layer 4c and the magnetization direction of the free magnetic layer 8 are made parallel to each other, the tunneling current easily flows, thereby minimizing the resistance.

As the magnetization direction of the free magnetic layer 8 changes by the effect of an external magnetic field on the basis of this principle, the changes in electrical resistance are detected as changes in voltage so as to detect a leakage magnetic field from a magnetic recording medium.

Features of the tunneling magnetic sensing element of this embodiment will be described below.

In this embodiment, the insulating barrier layer 5 is made of Mg—O (magnesium oxide).

The underlayer 1 which is the base layer of the laminate T1 is made of Ti, and the seed layer 2 which is formed on the underlayer 1 is made of one selected from Ni—Fe—Cr and Ru. The antiferromagnetic layer 3, the pinned magnetic layer 4, the insulating barrier layer 5, the free magnetic layer 8, and the protective layer 9 are formed on the seed layer 2 in order from below.

With this configuration, it is possible to increase the rate of change in resistance ($\Box$R/R) as compared with the related art while decreasing the RA (element resistance R$\Box$element area A) similarly to the related art. The RA is a very important factor for appropriate high-speed data transmission and high density recording. In this embodiment, the RA may be set, for example, in a small range of 2 to 5 $\Box\Box\Box$ m2. The term "related art" indicates the configuration in which the underlayer 1 is made of Ta.

As described above, in this embodiment, it is considered that the reason why the rate of change in resistance ($\Box$R/R) increases as compared with the related art is that the underlayer 1 is made of Ti such that the surface flatness of each layer is improved, or the laminated part of the layers including second pinned magnetic layer 4c/insulating barrier layer 5/enhance layer 6 is formed over a wider range than the related art so as to have a body-centered cubic structure (bcc structure) in which equivalent crystal planes represented by a {100} plane are preferentially aligned in a direction parallel to the interface (the X-Y plane).

Although it has been recognized that, with regard to the seed layer 2, Ni—Fe—Cr has a face-centered cubic structure (fcc structure), and Ru has a hexagonal close-packed structure (hcp structure), even though the seed layer 2 is made of any one of Ni—Fe—Cr and Ru, in this embodiment, it is possible to increase the rate of change in resistance ($\Box$R/R), as compared with the related art. Thus, it is considered that the base effect of the underlayer 1 made of Ti is exhibited, regardless of the crystal structure of the seed layer 2; however, from the experiment result described below, it is preferable that the seed layer 2 is made of Ni—Fe—Cr since it is possible to increase the rate of change in resistance ($\Box$R/R) more effectively.

When the seed layer 2 is made of Ni—Fe—Cr, the seed layer 2 is preferably made of a material represented by a composition formula {NixFe100-x}100-yCry (the atomic ratio x is in a range of 75 to 85, the Cr composition ratio y is in a range of 30 to 40).

The average thickness of the underlayer 1 is preferably equal to or larger than 10 Å and equal to or smaller than 100 Å. Therefore, it is possible to appropriately increase the rate of change in resistance ($\Box$R/R) and also to appropriately decrease the cap length (GL) between the lower shield layer 21 and the upper shield layer 26, and it is possible to stabilize the reproduction characteristics.

In this embodiment, in order to effectively obtain a high rate of change in resistance ($\Box$R/R), the second pinned magnetic layer 4c is formed so as to have a single-layered structure of Co—Fe—B or a laminated structure of Co—Fe—B and Co—Fe (Co—Fe is formed on the insulating barrier layer 5 side). The second pinned magnetic layer 4c is preferably made of Co—Fe—B represented by a composition formula (Co$\Box$Fe100-$\Box$)100-$\Box$B$\Box$ (where the atomic ratio $\Box$ is in a range of 0 to 75, and the composition ratio $\Box$ is in a range of 10 to 30 at %). Thus, the insulating barrier layer 5 and the enhance layer 6 formed on the second pinned magnetic layer 4c can be formed more effectively so as to have a body-centered cubic structure (bcc structure) in which equivalent crystal planes represented by a {100} plane are preferentially aligned in a direction parallel to the layer surface (the X-Y plane), thereby obtaining a high rate of change in resistance ($\Box$R/R).

This embodiment may be applied to a dual-type tunneling magnetic sensing element. That is, a laminate may be configured such that an underlayer 1, a seed layer 2, a (lower) antiferromagnetic layer 3, a (lower) pinned magnetic layer 4, a (lower) insulating barrier layer 5, a free magnetic layer 8, an upper insulating barrier layer, an upper pinned magnetic layer, an upper antiferromagnetic layer, and a protective layer 9 are laminated in order from below.

Figure 2:
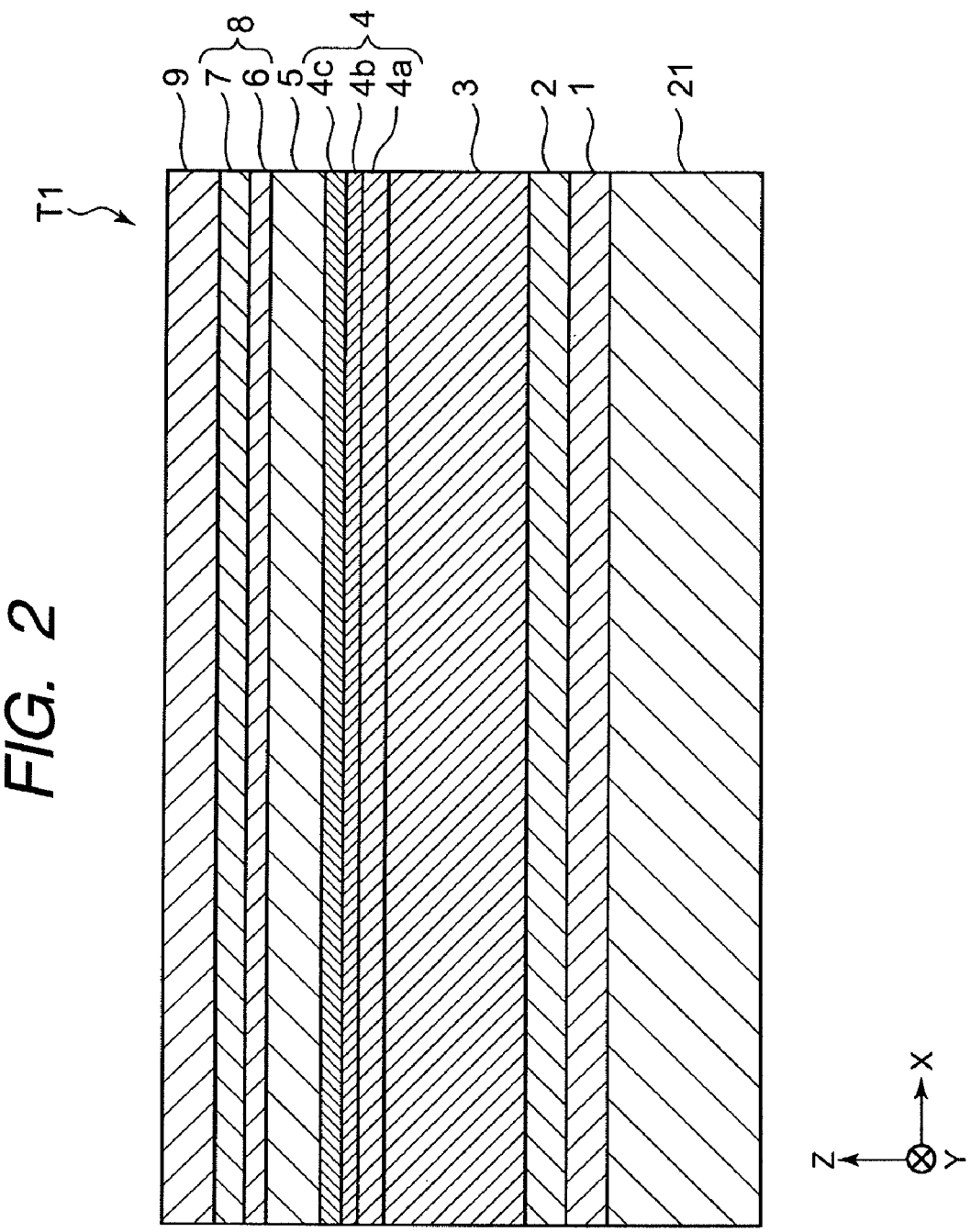
FIG. 2 is a sectional view of a tunneling magnetic sensing element during a manufacturing process taken in the same direction as in FIG. 1.
Figure 3:
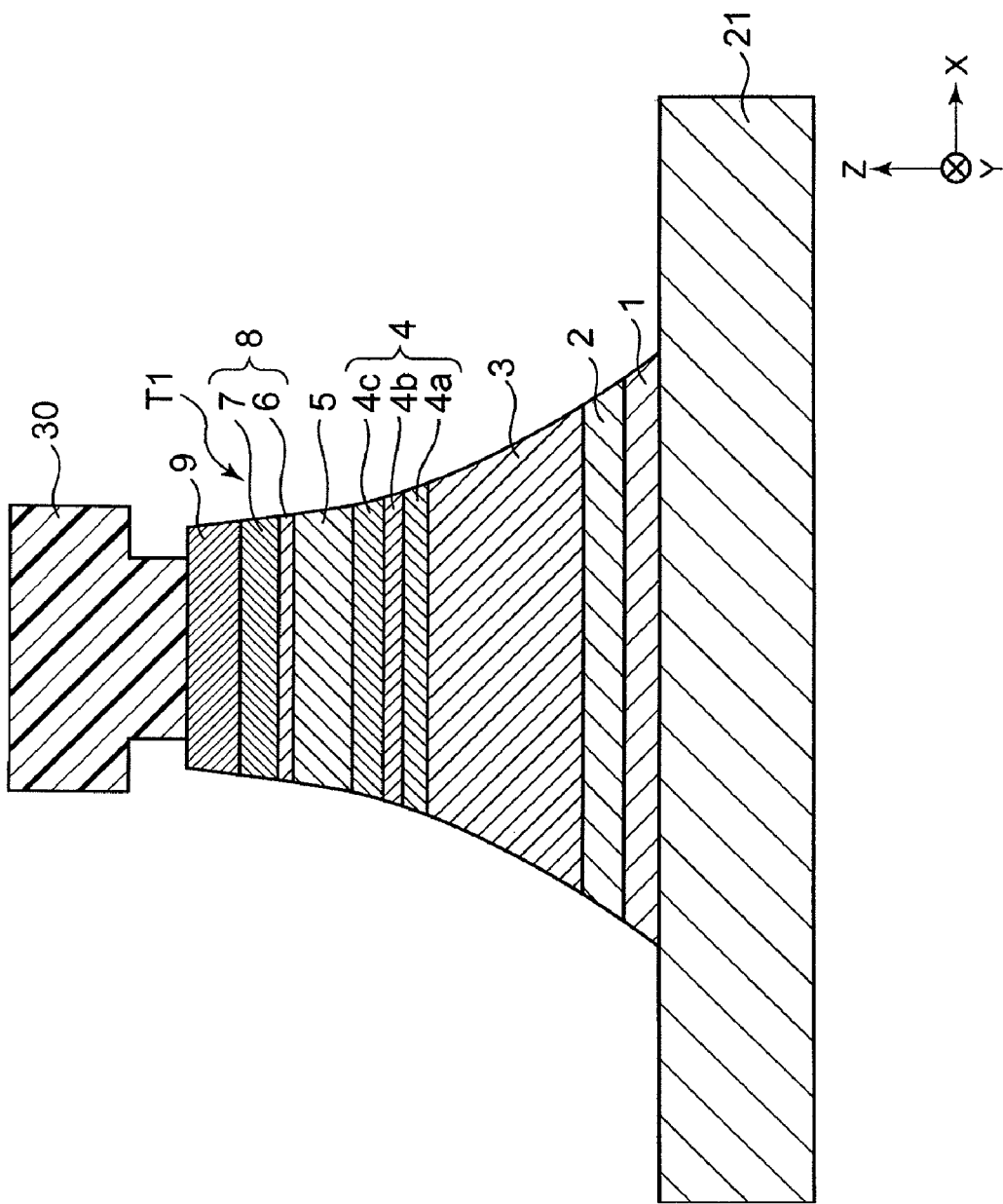
FIG. 3 is a process view (sectional view) showing a step subsequent to the step shown in FIG. 2.
Figure 4:
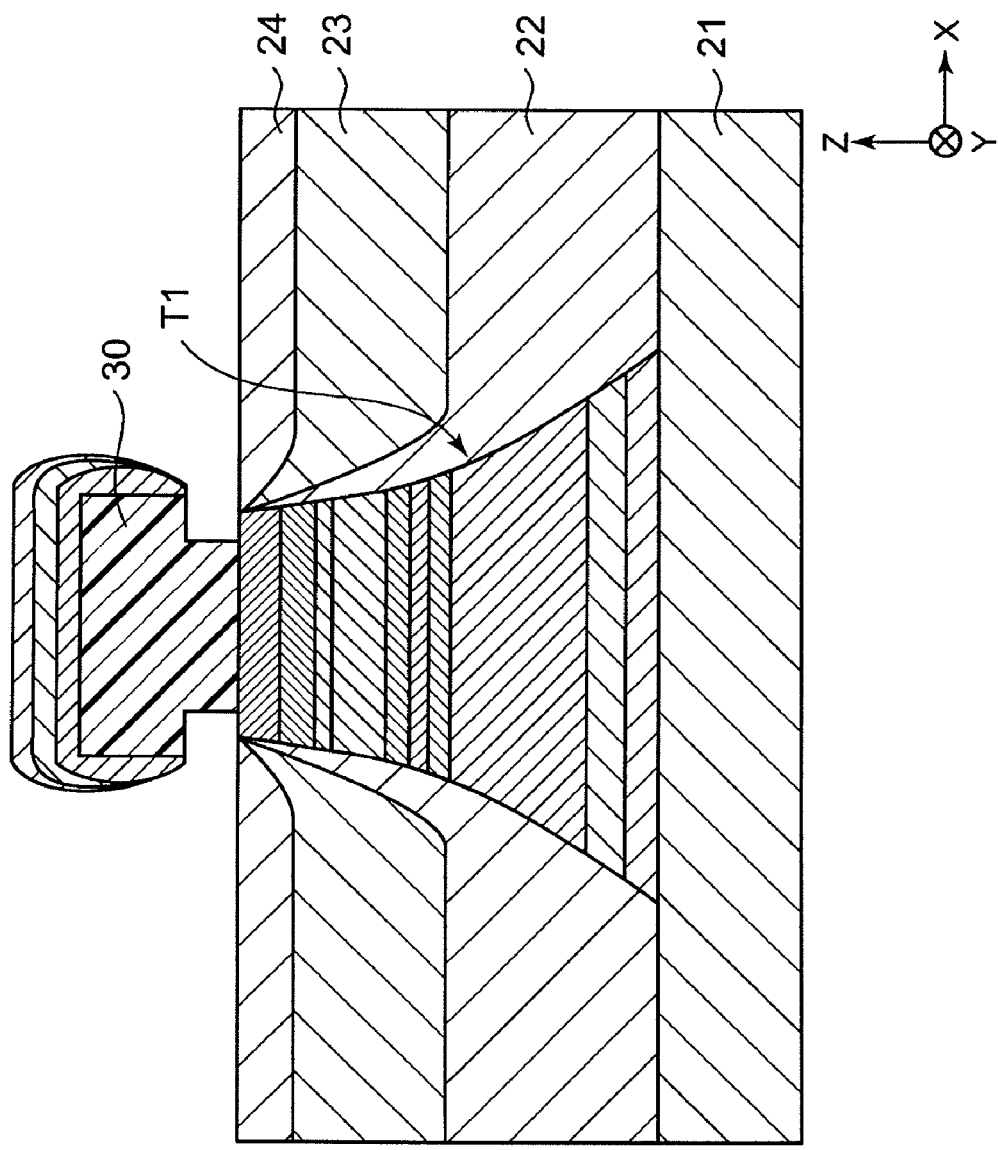
FIG. 4 is a process view (sectional view) showing a step subsequent to the step shown in FIG. 3.

A method of manufacturing a tunneling magnetic sensing element of this embodiment will be described. FIGS. 2 to 4 are partial sectional views of the tunneling magnetic sensing element during a manufacturing process. FIGS. 2 to 4 show the cross sections at the same position as that of the tunneling magnetic sensing element shown in FIG. 1.

In the step shown in FIG. 2, the underlayer 1, the seed layer 2, the antiferromagnetic layer 3, the first pinned magnetic layer 4a, the nonmagnetic intermediate layer 4b, and the second pinned magnetic layer 4c, the insulating barrier layer 5, the enhance layer 6, the soft magnetic layer 7, and the protective layer 9 are successively formed on the lower shield layer 21 in order from below under the same vacuum conditions.

In this embodiment, the underlayer 1 is made of Ti. The seed layer 2 is made of one selected from Ni—Fe—Cr and Ru. The insulating barrier layer 5 is made of Mg—O (magnesium oxide). The insulating barrier layer 5 is obtained by sputtering Mg—O on the second pinned magnetic layer 4c using an Mg—O target of a predetermined composition ratio. With regard to the materials of other layers, the description of FIG. 1 will be referred to.

Thus, the laminate T1 in which the layers from the underlayer 1 to the protective layer 9 are laminated is formed.

Next, a resist layer 30 for lift-off is formed on the laminate T1. Both ends of the laminate T1 in the track width direction (the X direction in the drawing), which are not covered with the resist layer 30 for lift-off are removed by etching or the like (see FIG. 3).

Next, the insulating layer 22, the hard bias layer 23, and the protective layer 24 are laminated on the lower shield layer 21 in order from below on both sides of the laminate T1 in the track width direction (the X direction in the drawing) (see FIG. 4).

Next, the resist layer 30 for lift-off is removed, and the upper shield layer 26 is formed on the laminate T1 and the protective layer 24.

The above-described method of manufacturing a tunneling magnetic sensing element includes a heat treatment after the laminate T1 is formed. A representative example of the heat treatment is a heat treatment under a magnetic field for generating an exchange coupling magnetic field (Hex) between the antiferromagnetic layer 3 and the first pinned magnetic layer 4a.

In this embodiment, the underlayer 1 is made of Ti, and the seed layer 2 directly formed on the underlayer 1 is made of one selected from Ni—Fe—Cr and Ru. The antiferromagnetic layer 3, the pinned magnetic layer 4, the insulating barrier layer 5, the free magnetic layer 8, and the protective layer 9 are laminated on the seed layer 2 in order from below.

Therefore, it is possible to appropriately manufacture a tunneling magnetic sensing element having a small RA similar to the related art and a high rate of change in resistance ($\square$R/R) as compared with the related art.

The tunneling magnetic sensing element of this embodiment may be used not only as a magnetic head provided in a hard disk device but also as a MRAM (Magnetoresistive Random Access Memory) or a magnetic sensor.

EXAMPLES 1 and 2

The tunneling magnetic sensing element shown in FIG. 1 was formed.

The laminate T1 was prepared by laminating the following layers in order from below: underlayer 1/seed layer 2/antiferromagnetic layer 3; Ir26 at % Mn74 at % (70)/pinned magnetic layer 4 [first pinned magnetic layer 4a; Fe30 at % Co70 at % (14)/nonmagnetic intermediate layer 4b; Ru (9.1)/second pinned magnetic layer 4c; {Co50Fe50}80 at % B20 at % (18)]/insulating barrier layer 5; Mg50 at % O50 at % (9 to 12)/free magnetic layer 8 [enhance layer 6; Fe50 at % Co50 at % (10)/soft magnetic layer 7; Ni87 at % Fe13 at % (50)/protective layer 9; [Ru (20)/Ta (280)].

The numerical value in the parenthesis of each layer in the laminate represents an average thickness, and the thickness is measured in Å.

In the experiment, a sample in which the underlayer 1 was made of Ti so as to have an average thickness of 30 Å, and the seed layer 2 was made of {Ni80Fe20}64.4 at % Cr35.6 at % so as to have an average thickness of 50 Å was prepared for Example 1. A sample in which the underlayer 1 was made of Ti so as to have an average thickness of 30 Å, and the seed layer 2 was made of Ru so as to have an average thickness of 40 Å was prepared for Example 2.

After the laminate was formed, a heat treatment was performed at 270° C. for 3 hours and 40 minutes.

RELATED ART EXAMPLES 1 and 2

A sample in which, in the laminate of the above-described example, the underlayer 1 was made of Ta so as to have an average thickness of 30 Å, and the seed layer 2 was made of {Ni80Fe20}64.4 at % Cr35.6 at % so as to have an average thickness of 50 Å was prepared for Related Art Example 1. A sample in which the underlayer 1 was made of Ta so as to have an average thickness of 30 Å, and the seed layer 2 was made of Ru so as to have an average thickness of 40 Å was prepared for Related Art Example 2.

The relationship between the RA and the rate of change in resistance ($\square$R/R) of each sample of Example 1, Example 2, Related Art Example 1, and Related Art Example 2 was measured at multiple points with the average thickness of the insulating barrier layer 5 changed in a range of 9 Å to 12 Å. The result is shown in FIG. 5.

Figure 5:
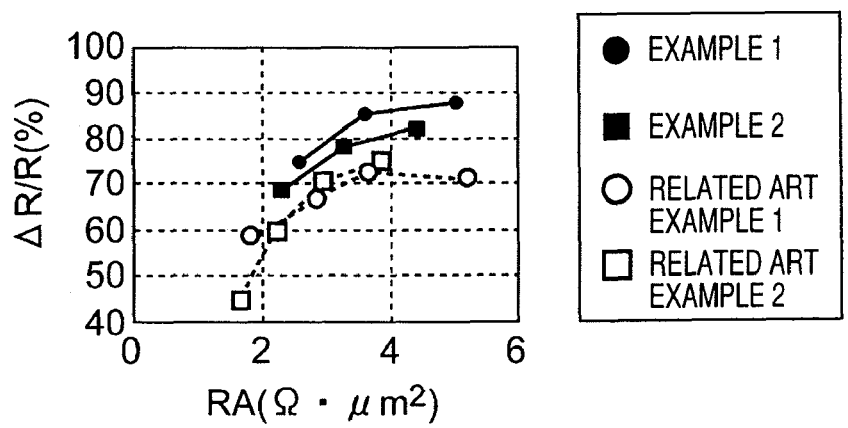
FIG. 5 is a graph showing the relationship between RA and the rate of change in resistance ($\Delta R/R$) of each of Example 1 (underlayer: Ti/seed layer: Ni—Fe—Cr), Example 2 (underlayer: Ti/seed layer: Ru), Related Art Example 1 (underlayer: Ti/seed layer: Ni—Fe—Cr), and Related Art Example 2 (underlayer: Ti/seed layer: Ru) with an insulating barrier layer made of Mg—O.

As shown in FIG. 5, in Example 1 and Example 2, when the RA is the same as that in Related Art Example 1 and Related Art Example 2, a rate of change in resistance ($\square$R/R) higher than that in Related Art Example 1 and Related Art Example 2 could be obtained.

The RA can be adjusted in a range of 2 to 5 $\square\square\square$ m2. In Example 1 and Example 2, a high rate of change in resistance ($\square$R/R) could be increased in a small range of RA as compared with the related art.

From the experiment result of FIG. 5, it could be seen that, when the underlayer 1 is made of Ti, not Ta, and the seed layer 2 is made of Ni—Fe—Cr or Ru, the rate of change in resistance ($\square$R/R) could be increased effectively as compared with the related art.

In Example 1, the seed layer 2 is made of Ni—Fe—Cr, while in Example 2, the seed layer 2 is made of Ru. In this case, as shown in FIG. 5, the rate of change in resistance ($\square$R/R) increased more in Example 1 than in Example 2.

Therefore, it could be seen that, with a combination in which the underlayer 1 was made of Ti, and the seed layer 2 formed on the underlayer 1 was made of Ni—Fe—Cr, in a tunneling magnetic sensing element including an insulating barrier layer made of Mg—O, the rate of change in resistance ($\square$R/R) could be increased more effectively with a small RA.

COMPARATIVE EXAMPLES 1 and 2

A tunneling magnetic sensing element including an insulating barrier layer made of Ti—Mg—O was formed.

A laminate was prepared by laminating the following layers in order from below: underlayer/seed layer/antiferromagnetic layer; Ir26 at % Mn74 at % (70)/pinned magnetic layer [first pinned magnetic layer; Fe30 at % Co70 at % (16)/nonmagnetic intermediate layer; Ru (9.1)/second pinned magnetic layer; Co90 at % Fe10 at % (18)]/insulating barrier layer/free magnetic layer [enhance layer; Fe90 at % Co10 at % (10)/soft magnetic layer 7; Ni88 at % Fe12 at % (50)/protective layer; [Ru (20)/Ta (280)].

The numerical value in the parenthesis of each layer in the laminate represents an average thickness, and the thickness is measured in Å.

In the experiment, a Ti layer was formed on the second pinned magnetic layer so as to have an average thickness of 4.8 Å, an Mg layer was formed on the Ti layer so as to have an average thickness of 0.6 Å, and the Ti layer and the Mg layer were oxidized to obtain an insulating barrier layer made of Ti—Mg—O.

A sample in which the underlayer was made of Ti so as to have an average thickness of 30 Å, and the seed layer was made of {Ni80Fe20}64.4 at % Cr35.6 at % so as to have an average thickness of 50 Å was prepared for Comparative Example 1. A sample in which the underlayer 1 was made of Ti so as to have an average thickness of 30 Å, and the seed layer 2 was made of Ru so as to have an average thickness of 40 Å was prepared for Comparative Example 2.

After the laminate was formed, a heat treatment was performed at 270°C for 3 hours and 40 minutes.

RELATED ART EXAMPLES 3 and 4

A sample in which, in the laminate of each of Comparative Examples 1 and 2, the underlayer 1 was made of Ta so as to have an average thickness of 30 Å, and the seed layer 2 was made of {Ni80Fe20}64.4 at % Cr35.6 at % so as to have an average thickness of 50 Å was prepared for Related Art Example 3. A sample in which the underlayer 1 was made of Ta so as to have an average thickness of 30 Å, and the seed layer 2 was made of Ru so as to have an average thickness of 40 Å was prepared for Related Art Example 4.

The relationship between the RA and the rate of change in resistance ($\Delta R/R$) of each sample of Comparative Example 1, Comparative Example 2, Related Art Example 3, and Related Art Example 4 was measured. With regard to each sample of Comparative Example 1 and Comparative Example 2, the experiment result was obtained at multiple points with an oxidization time changed when the insulating barrier layer is formed. The result is shown in FIG. 6.

Figure 6:
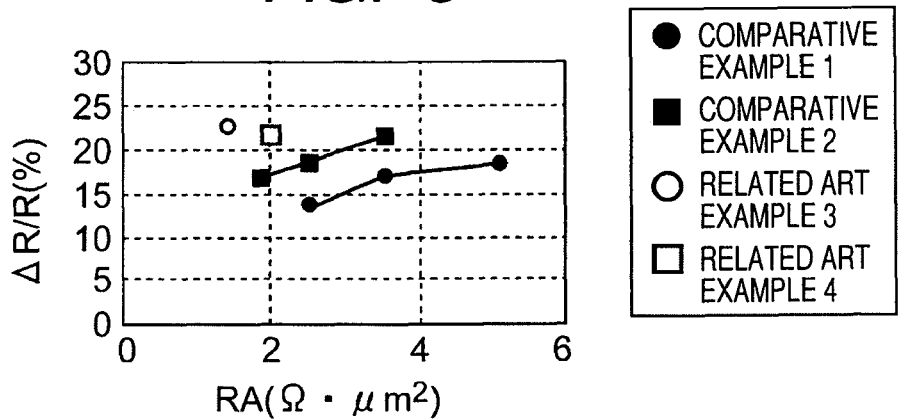
FIG. 6 is a graph showing the relationship between RA and the rate of change in resistance ($\Delta R/R$) of each of Comparative Example 1 (underlayer: Ti/seed layer: Ni—Fe—Cr), Comparative Example 2 (underlayer: Ti/seed layer: Ru), Related Art Example 3 (underlayer: Ti/seed layer: Ni—Fe—Cr), and Related Art Example 3 (underlayer: Ti/seed layer: Ru) with an insulating barrier layer made of Ti—Mg—O.

As shown in FIG. 6, in Comparative Example 1 and Comparative Example 2, the rate of change in resistance ($\Delta R/R$) was decreased further than that in Related Art Example 3 and Related Art Example 4.

COMPARATIVE EXAMPLE 3

A tunneling magnetic sensing element including an insulating barrier layer made of Al—O was formed.

A laminate was prepared by laminating the following layers in order from below: underlayer/seed layer/antiferromagnetic layer; Ir26 at % Mn74 at % (80)/pinned magnetic layer [first pinned magnetic layer; Fe30 at % Co70 at % (21)/nonmagnetic intermediate layer; Ru (9.1)/second pinned magnetic layer; [{Co75Fe25}80 at % B20 at % (19)/Co70 at % Fe30 at % (6)]]/insulating barrier layer/free magnetic layer [enhance layer; Fe80 at % Co20 at % (10)/soft magnetic layer 7; Ni88 at % Fe12 at % (50)/protective layer; [Ru (20)/Ta (280)].

The numerical value in the parenthesis of each layer in the laminate represents an average thickness, and the thickness is measured in Å.

In the experiment, an Al layer was formed on the second pinned magnetic layer so as to have an average thickness of 4.3 Å, and the Al layer was oxidized to obtain an insulating barrier layer made of Al—O.

A sample in which the underlayer was made of Ti so as to have an average thickness of 20 Å, and the seed layer was made of Ru so as to have an average thickness of 30 Å was prepared for Comparative Example 3.

After the laminate was formed, a heat treatment was performed at 270°C for 3 hours and 40 minutes.

RELATED ART EXAMPLE 5

A sample in which, in the laminate of Comparative Example 3, the underlayer was made of Ta so as to have an average thickness of 20 Å, and the seed layer 2 was made of Ru so as to have an average thickness of 30 Å was prepared for Related Art Example 5.

The relationship between the RA and the rate of change in resistance ($\Delta R/R$) of each sample of Comparative Example 3 and Related Art Example 5 was measured. The result is shown in FIG. 7.

Figure 7:
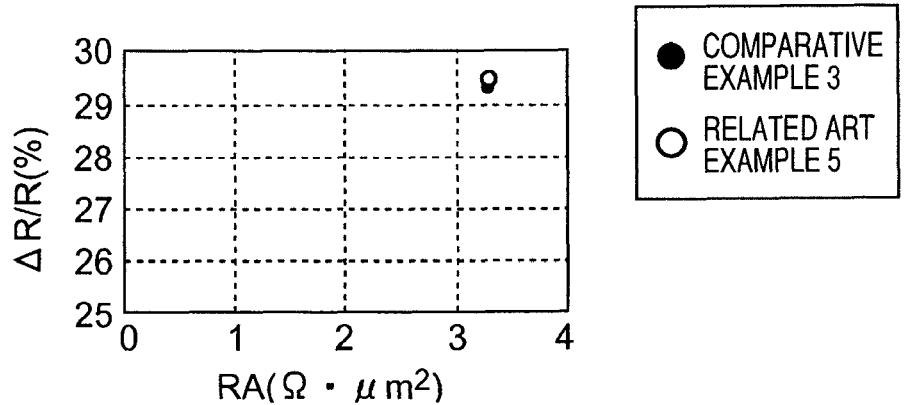
FIG. 7 is a graph showing the relationship between RA and the rate of change in resistance ($\Delta R/R$) of each of Comparative Example 3 (underlayer: Ti/seed layer: Ru) and Related Art Example 5 (underlayer: Ti/seed layer: Ru) with an insulating barrier layer made of Al—O.

As shown in FIG. 7, the rate of change in resistance ($\Delta R/R$) of Comparative Example 3 was lower than the rate of change in resistance ($\Delta R/R$) of Related Art Example 5.

From the experiment results of FIGS. 5 to 7, it could be seen that, the effect of increasing the rate of change in resistance ($\Delta R/R$) by the underlayer made of Ti and the seed layer made of one selected from Ni—Fe—Cr and Ru was exhibited when the insulating barrier layer was made of Mg—O.

It should be understood by those skilled in the art that various modifications, combinations, sub-combinations and alterations may occur depending on design requirements and other factors insofar as they are within the scope of the appended claims or the equivalents thereof.

The invention claimed is:

1. A tunneling magnetic sensing element comprising:
a laminate in which an underlayer, a seed layer, an antiferromagnetic layer, a pinned magnetic layer, an insulating barrier layer, and a free magnetic layer are laminated in order from below,
wherein the insulating barrier layer is made only of Mg—O,
the underlayer is made of Ti, and the seed layer is made of one selected from a group consisting of Ni—Fe—Cr and Ru, and
the average thickness of the underlayer is equal to or larger than 10 Å and equal to or smaller than 100 Å.

2. The tunneling magnetic sensing element according to claim 1, wherein the seed layer is made of Ni—Fe—Cr.

* * * * *